United States Patent
Wada

(10) Patent No.: US 9,728,678 B2
(45) Date of Patent: Aug. 8, 2017

(54) LIGHT EMITTING ELEMENT AND METHOD OF MANUFACTURING THE SAME

(71) Applicant: TOYODA GOSEI CO., LTD., Kiyosu-shi (JP)

(72) Inventor: Satoshi Wada, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/631,764

(22) Filed: Feb. 25, 2015

(65) Prior Publication Data

US 2015/0280065 A1    Oct. 1, 2015

(30) Foreign Application Priority Data

Mar. 28, 2014 (JP) ................... 2014-069842

(51) Int. Cl.
| | |
|---|---|
| H01J 1/62 | (2006.01) |
| H01L 33/22 | (2010.01) |
| H01L 33/50 | (2010.01) |
| H01L 33/00 | (2010.01) |
| H01L 33/44 | (2010.01) |

(52) U.S. Cl.
CPC .......... H01L 33/22 (2013.01); H01L 33/501 (2013.01); H01L 33/0095 (2013.01); H01L 33/44 (2013.01); H01L 2933/0041 (2013.01)

(58) Field of Classification Search
None
See application file for complete search history.

(56) References Cited

U.S. PATENT DOCUMENTS

| | | | | |
|---|---|---|---|---|
| 4,479,027 | A * | 10/1984 | Todorof | 136/249 |
| 7,923,918 | B2 * | 4/2011 | Tamaki | C09K 11/02 313/501 |
| 9,487,697 | B2 * | 11/2016 | Kinoshita | C09K 11/7792 |
| 2012/0043559 | A1 * | 2/2012 | Hiramatsu | H01L 33/502 257/88 |
| 2012/0286646 | A1 * | 11/2012 | Sakuta | C09K 11/7739 313/501 |

(Continued)

FOREIGN PATENT DOCUMENTS

| | | |
|---|---|---|
| JP | H04-206549 A | 7/1992 |
| JP | 2004-221536 A | 8/2004 |

(Continued)

OTHER PUBLICATIONS

Japanese Office Action dated Jan. 10, 2017, with an English translation thereof.

*Primary Examiner* — Ali Naraghi
(74) *Attorney, Agent, or Firm* — McGinn IP Law Group, PLLC.

(57) ABSTRACT

A light emitting element includes a crystal growth substrate formed in a flat shape and that has a translucency, a semiconductor layer that constitutes a light emitting element structure and is formed at a side of a first surface of the crystal growth substrate, irregularities formed on a second surface of the crystal growth substrate, the second surface being an opposite surface of the first surface, and a protective layer that has a translucency and a predetermined hardness and brittleness, and covers the irregularities formed on the second surface of the crystal growth substrate.

12 Claims, 4 Drawing Sheets

(56) References Cited

U.S. PATENT DOCUMENTS

| | | | |
|---|---|---|---|
| 2013/0337719 A1* | 12/2013 | Chen | H01L 33/58 445/23 |
| 2014/0003038 A1* | 1/2014 | Kim et al. | 362/145 |
| 2014/0061710 A1* | 3/2014 | Kim | H01L 33/0079 257/98 |
| 2014/0103391 A1 | 4/2014 | Haruta et al. | |
| 2015/0007881 A1* | 1/2015 | Khadilkar et al. | 136/256 |
| 2015/0075608 A1* | 3/2015 | Abou-Kandil et al. | 136/256 |

FOREIGN PATENT DOCUMENTS

| | | |
|---|---|---|
| JP | 2007-142277 A | 6/2007 |
| JP | 2012-231122 A | 11/2012 |
| JP | 2013-004480 A | 1/2013 |

\* cited by examiner

POLISHING

LIGHT EMITTING ELEMENT AND METHOD OF MANUFACTURING THE SAME

CROSS REFERENCE TO RELATED APPLICATIONS

This application claims the benefit of Japanese Patent Application (No. P2014-069842) filed on Mar. 28, 2014, the entire contents of which are incorporated herein by reference.

BACKGROUND OF THE INVENTION

1. Field of the Invention

The present invention relates to a light emitting element and a method of manufacturing the same. More particularly, the present invention relates to a light emitting element where irregularities are formed on one surface of a crystal growth substrate, and a method of manufacturing the same.

2. Description of the Related Art

Patent Document 1 discloses a nitride-based LED where a light emitting structure made of a nitride semiconductor is provided on a front surface of a nitride semiconductor substrate. Here, a roughened region is provided on a back surface of the nitride semiconductor substrate. The roughened region is provided with a plurality of protrusions. The light generated in the light emitting structure is emitted to the outside through the roughened region.

Patent Document 2 discloses a manufacturing method of a light emitting element where a light emitting layer made of a group III nitride semiconductor is provided on one surface of a crystal growth substrate having a translucency and a surface of the crystal growth substrate, which is an opposite surface of the surface having the light emitting layer provided thereon, is an emitting surface from which the light of the light emitting layer is emitted. This method includes an irregularities forming process for forming irregularities in at least the emitting surface of the crystal growth substrate provided with the light emitting layer, a protective film forming process for forming a protective film on at least the emitting surface of the crystal growth substrate provided with the light emitting layer, a scribe groove forming process for forming a dicing scribe groove, by a laser, in the crystal growth substrate having the protective film formed on the emitting surface, a contaminant removing process for removing contaminants adhering to an inner surface of the scribe groove in the scribe groove forming process, and a protective film removing process for removing the protective film after the contaminant removing process.

Patent Document 1: JP-A-2012-231122
Patent Document 2: JP-A-2007-142277

Conventionally, a technique has been known which is capable of improving a light extraction efficiency of a light emitting element by forming irregularities (roughened region) on one surface of a crystal growth substrate, which is an opposite surface of a surface on which a semiconductor layer constituting a light emitting element structure is formed (e.g., see Patent Document 1 and Patent Document 2).

When manufacturing the light emitting element, there has been used a method of dividing a wafer of the stacked crystal growth substrate into a plurality of light emitting elements and then forming irregularities on one surface of the crystal growth substrate for each of the light emitting elements (e.g., see Patent Document 1). However, this method has a problem of low productivity because it takes a lot of man-hours.

Accordingly, in order to improve productivity, there has been used a method of forming the irregularities on one surface of the wafer of the crystal growth substrate and then dividing the wafer of the stacked crystal growth substrate into a plurality of light emitting elements by a scribe breaking.

When dividing the wafer of the stacked crystal growth substrate into a plurality of light emitting elements, a breaking blade of a breaking device is pressed against one surface of the crystal growth substrate.

At this time, when the irregularities are formed on one surface of the crystal growth substrate, the breaking blade is deviated by the irregularities and therefore the contact position of the breaking blade is not determined. Accordingly, the load from the breaking blade is not properly applied to a dividing line portion of the crystal growth substrate. Consequently, there is a problem that separation failure (dividing failure) is liable to occur. That is, the crystal growth substrate may be divided at a portion other than the dividing line portion or the cross-section of the crystal growth substrate may be slanted and broken.

When the crystal growth substrate is a gallium nitride substrate, the gallium nitride substrate has a light transmittance lower than a sapphire substrate generally used. Accordingly, it is required to cause the gallium nitride substrate to be thinner in order to improve the light extraction efficiency of the light emitting element. However, the separation failure is liable to occur especially in the thinned gallium nitride substrate.

Further, the thinned gallium nitride substrate is liable to be damaged. Accordingly, there is also a problem that the handling such as the tape transfer is difficult to perform.

Further, when dividing the wafer of the stacked crystal growth substrate into a plurality of light emitting elements, a wafer fixing tape is adhered to one surface (exposed surface) of the crystal growth substrate. However, the adhesion of the wafer fixing tape is damaged when irregularities are formed on one surface of the crystal growth substrate. Accordingly, there is a problem that the light emitting element is liable to be separated from the wafer fixing tape.

Further, when feeding the light emitting element by a collet in order to mount the light emitting element on a mounting substrate, one surface (exposed surface) of the crystal growth substrate is absorbed by the collet. However, the absorption is deteriorated when the irregularities are formed on one surface of the crystal growth substrate. Accordingly, there is a problem that the light emitting element is liable to be separated from the collet.

Further, when bonding the light emitting element to a wiring pattern formed on the mounting substrate, it is required to apply load on one surface (exposed surface) of the crystal growth substrate. However, in this case, there is a problem that the irregularities are liable to be damaged by the application of the load when the irregularities are formed on one surface of the crystal growth substrate.

SUMMARY OF THE INVENTION

The present invention has been made to solve the above problems and has the following objects.

(1) The present invention provides a light emitting element in which light extraction efficiency is high and separation failure is less liable to occur when dividing the wafer of the crystal growth substrate by a breaking.

(2) The present invention provides a manufacturing method that is capable of improving productivity of the light emitting element of the object (1).

The present inventors have intensively studied in order to solve the above problems and reached each aspect of the present invention as described below.

<First Aspect>

The first aspect provides a light emitting element comprising:

a crystal growth substrate formed in a flat shape and that has a translucency;

a semiconductor layer that constitutes a light emitting element structure and is formed at a side of a first surface of the crystal growth substrate;

irregularities formed on a second surface of the crystal growth substrate, the second surface being an opposite surface of the first surface; and a protective layer that has a translucency and a predetermined hardness and brittleness, and covers the irregularities formed on the second surface of the crystal growth substrate.

In the first aspect, the light generated in the semiconductor layer constituting the light emitting element structure is transmitted through the protective layer from the second surface of the crystal growth substrate, which is formed with the irregularities, and emitted to the outside of the light emitting element.

Here, since the light generated in the semiconductor layer is diffused at the irregularities on the second surface of the crystal growth substrate, it is possible to suppress the multiple reflections on the inside of the light emitting element. Accordingly, the light extraction efficiency of the light emitting element can be improved.

Further, when the irregularities are formed on the second surface of the crystal growth substrate, the reflectivity of the light that is generated in the semiconductor layer and incident on the second surface is lowered. Accordingly, it is possible to increase the light transmittance, so that the light extraction efficiency of the light emitting element can be improved.

Further, when the irregularities are formed on the second surface of the crystal growth substrate, the contact area between the second surface of the crystal growth substrate and the protective layer is increased. Accordingly, it is possible to firmly fix the second surface of the crystal growth substrate and the protective layer.

In the case of manufacturing the light emitting element of the first aspect, when dividing the wafer of the stacked crystal growth substrate, the semiconductor layer and the protective layer into a plurality of light emitting elements, the breaking blades of the breaking device are pressed against the surface of the protective layer.

At this time, even when the irregularities are formed on the second surface of the crystal growth substrate, the protective layer has a predetermined hardness and brittleness since the irregularities are covered by the protective layer.

Therefore, the breaking blades pressed against the surface of the protective layer are not deviated and the contact positions of the breaking blades are determined. Accordingly, the load from the breaking blades is securely applied to the dividing line portions on the surface of the protective layer.

As a result, it is possible to prevent the occurrence of separation failure including that the crystal growth substrate is divided from the portions other than the dividing line portions or the cross-section of the crystal growth substrate is slanted and broken.

The predetermined hardness and brittleness assigned to the protective layer refer to a hardness and brittleness sufficient for causing the protective layer to be cut by the load applied from the breaking blades.

Further, in the case of manufacturing the light emitting element of the first aspect, when dividing, the wafer of the crystal growth substrate, the semiconductor layer and the protective layer which are stacked, into a plurality of light emitting elements, a wafer fixing tape is adhered to the surface of the protective layer.

At this time, even when the irregularities are formed on the second surface of the crystal growth substrate, the adhesion of the wafer fixing tape is not damaged since the irregularities are covered by the protective layer. Accordingly, it is possible to prevent the light emitting element from being separated from the wafer fixing tape.

Further, when feeding the light emitting element by a collet in order to mount the light emitting element on a mounting substrate, the surface of the protective layer is absorbed by the collet.

At this time, even when the irregularities are formed on the second surface of the crystal growth substrate, the absorption of the collet is not damaged since the irregularities are covered by the protective layer. Accordingly, it is possible to prevent the light emitting element from being separated from the collet.

Further, when bonding the light emitting element to a wiring pattern formed on a mounting substrate, it is required to apply load to the surface of the protective layer. At this time, even when the irregularities are formed on the second surface of the crystal growth substrate, it is possible to prevent the irregularities from being damaged by the application of the load since the irregularities are covered by the protective layer.

By the way, in the technique disclosed in Patent Document 2, a protective film is formed on a second surface (emitting surface) of the crystal growth substrate.

In the technique disclosed in Patent Document 2, contaminants are adhered to the inner surface of the scribe grooves at the time of forming the scribe grooves on the second surface of the crystal growth substrate. Here, the purpose of providing the protective film is to prevent the irregularities on the second surface of the crystal growth substrate from being damaged or becoming uneven when removing the contaminants.

Further, in the technique disclosed in Patent Document 2, the protective film is removed after the removal of the contaminants in the scribe grooves. Accordingly, the protective film is not left in the light emitting element.

Furthermore, Patent Document 2 discloses that a synthetic resin is used as the material of the protective film and it is preferable that the protective film has a high elasticity (see Paragraph [0035] of Patent Document 2).

By contrast, the protective layer in the first aspect has a translucency and a predetermined hardness and brittleness. Further, the protective layer has a specific configuration to cover the second surface of the light emitting element.

Since the protective layer has the brittleness, the protective layer can be also divided along dividing surfaces of each light emitting element when being divided into a plurality of light emitting elements.

However, in Patent Document 2, a technique corresponding to the protective layer that is a specific configuration of the first aspect is neither disclosed nor suggested.

Accordingly, in Patent Document 2, the above operation/effects of the first aspect cannot be obtained.

Consequently, even those skilled in the art cannot reach the first aspect based on Patent Document 2 having an object and a configuration different from the first aspect. Further, the above operation/effects of the first aspect cannot be expected by those skilled in the art.

<Second Aspect>

As the second aspect, the protective layer comprises at least one of phosphors and light-scattering material.

In the second aspect, the protective layer containing phosphors functions as a luminescent color conversion member. Further, a primary light (blue light) is an excitation light generated in the semiconductor layer and a portion of the primary light is excited by the phosphors in the protective layer to generate a luminescent color-converted (wavelength-converted) secondary light (yellow light). The primary light and the secondary light are mixed to generate a mixed-color light (white light). The mixed-color light is emitted to the outside through the protective layer.

Therefore, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting element and surrounding components thereof are deteriorated due to the heat-generation. Accordingly, it is necessary to efficiently dissipate the heat generated by the phosphors.

In the second aspect, the contact area between the second surface of the crystal growth substrate and the protective layer is increased by forming the irregularities on the second surface of the crystal growth substrate.

As a result, the heat generated by the phosphors contained in the protective layer can be effectively dissipated through the light emitting element. Accordingly, in addition to improving the efficiency of the luminescent color conversion by suppressing the temperature rise of the phosphors, the components of the light emitting element and surrounding components thereof can be prevented from being deteriorated by the heat-generation.

Further, in the second aspect, the protective layer containing the light scattering material functions as a light scattering member and the light incident on the protective layer from the crystal growth substrate is scattered by the light scattering material in the protective layer. Accordingly, the light extraction efficiency of light emitted through the protective layer can be further improved.

<Third Aspect>

As the third aspect, the protective layer is made of a sintered body of mixed particles of combined body particles and glass particles, and the combined body particles are dispersed in a glass, the combined body particles being obtained by mixing and binding phosphors and dispersed binders, and the dispersed binders are non-glass materials having a translucency and a binding property to the phosphors.

In the third aspect, the particle size of the phosphors is reduced, the phosphors are uniformly and densely dispersed in the interior of the protective layer and a state is obtained where a plurality of phosphors are distributed to be overlapped in a thickness direction of the protective layer. As a result, it is possible to provide the protective layer capable of obtaining a uniform chromaticity distribution.

Meanwhile, the combined body particles may be a particle obtained by the association/aggregation of the particles of the phosphors and the particles of the dispersed binders, or a particle of a sintered body of the phosphors and the dispersed binders.

Further, the protective layer where the combined body particles are dispersed in a glass has a high brittleness.

Therefore, in the third aspect, when dividing the wafer of the stacked crystal growth substrate, the semiconductor layer and the protective layer into a plurality of light emitting elements by a breaking, the protective layer can be easily cut by the load applied from the breaking blades. Accordingly, it is possible to reliably prevent the occurrence of the separation failure.

<Fourth Aspect>

The fourth aspect provides the light emitting element further comprising an optical thin film that covers the whole surface of a front surface side of the protective layer.

In the fourth aspect, of the light generated in the semiconductor layer, only the light having a desired wavelength is transmitted through the optical thin film and emitted to the outside from the light emitting element. Accordingly, it is possible to control the wavelength of the emitted light of the light emitting element.

<Fifth Aspect>

The fifth aspect provides a method of manufacturing the light emitting element according to the first aspect, the method comprising:

a first process for forming the semiconductor layer at a side of a first surface of a wafer of the crystal growth substrate;

a second process for forming the irregularities on a second surface of the wafer of the crystal growth substrate;

a third process for forming the protective layer at a side of the second surface of the wafer of the crystal growth substrate, the protective layer covering the irregularities; and a fourth process for dividing, the wafer of the crystal growth substrate, the semiconductor layer and the protective layer which are stacked, into a plurality of light emitting elements by adhering a wafer fixing tape to the protective layer and pressing a breaking blade of a breaking device against a dividing line portion on a surface of the protective layer via the wafer fixing tape.

In the fifth aspect, it is possible to improve productivity, as compared to a method of dividing each of the light emitting elements from the wafer of the crystal growth substrate and then forming the irregularities on the second surface of the crystal growth substrate.

DETAILED DESCRIPTION OF THE EXEMPLARY EMBODIMENTS

Figure 1A:
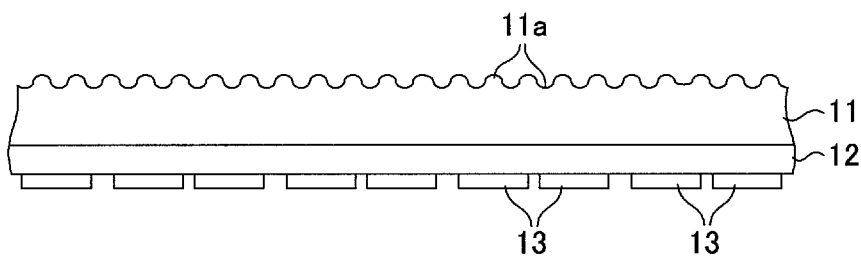
FIGS. 1A to 1O are longitudinal sectional views for explaining a method of manufacturing a light emitting element 10 of first to third embodiments and a light emitting element 30 of a fourth embodiment of the present invention.
Figure 1B:
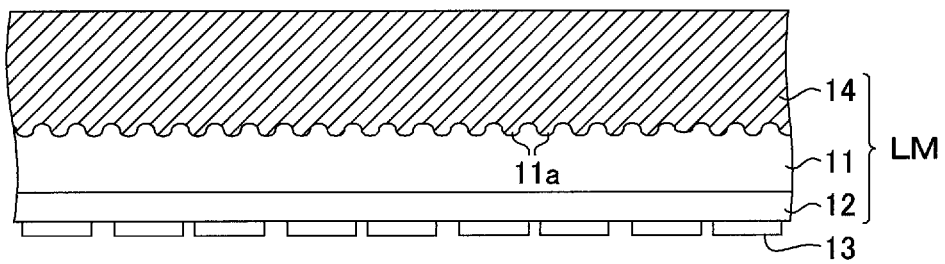
Figure 1C:
Figure 1C:
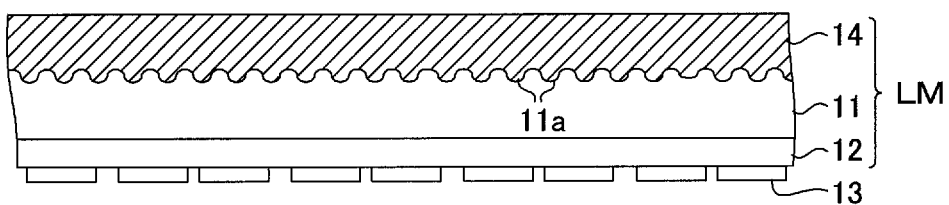

Hereinafter, respective illustrative embodiments of the present invention will be described with reference to the drawings. In addition, in the respective illustrative embodiments, the same constituent parts and components are denoted by the same reference numerals and a duplicated description thereof will be omitted.

Further, in respective drawings, in order to simplify the description, the size, shape and arrangement of the components in the respective illustrative embodiments are schematically shown in an exaggerated manner. In addition, the size, shape and arrangement of the components may be different from the actual.

First Embodiment

Figure 2A:
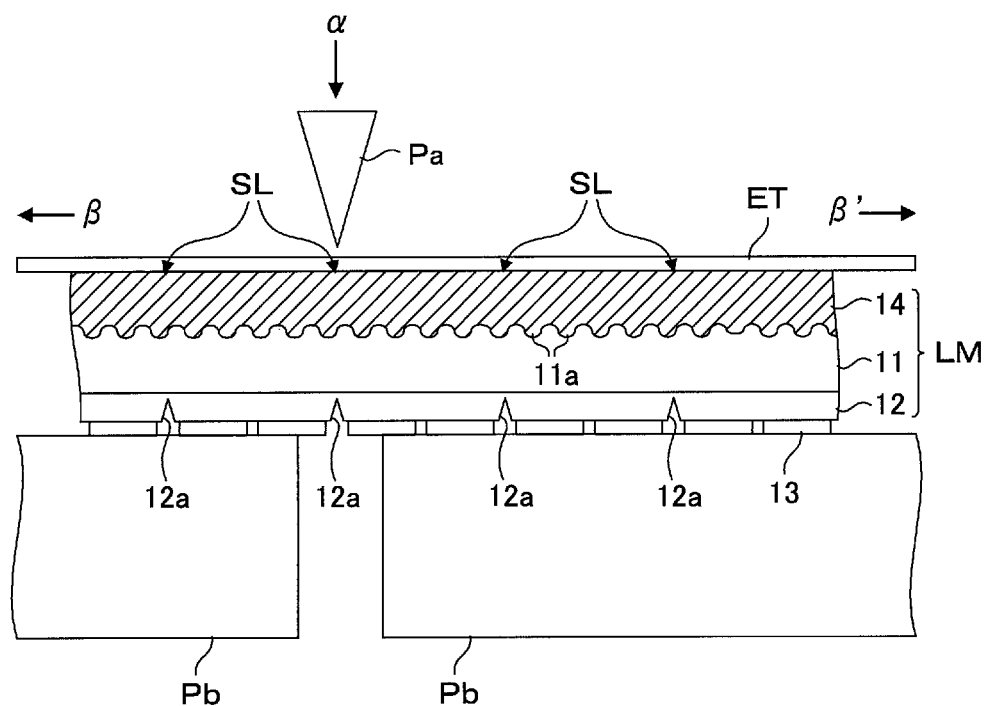
FIGS. 2A and 2B are longitudinal sectional views for explaining a method of manufacturing the light emitting element 10.
Figure 2B:
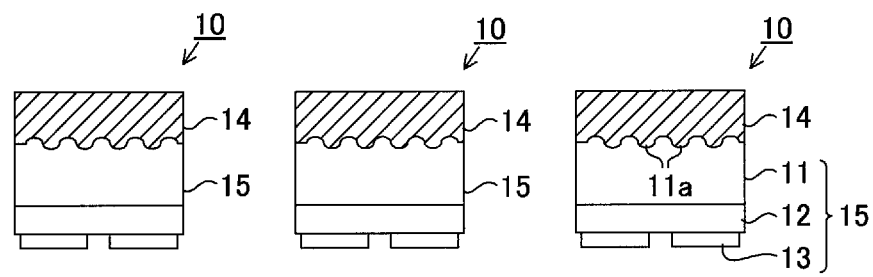

As shown in FIG. 2B, a light emitting element 10 of a first embodiment includes a protective layer 14 and an LED (Light Emitting Diode) chip 15.

The LED chip 15 includes a crystal growth substrate (growth substrate) 11, fine irregularities 11a, a semiconductor layer (light emitting layer) 12, and electrodes 13. The crystal growth substrate 11 is formed in a flat shape and has a transparency. The fine irregularities 11a are formed on a second surface of the crystal growth substrate 11. The semiconductor layer 12 constitutes a light emitting element structure that is formed on a first surface (opposite surface of the second surface) side of the crystal growth substrate 11. The electrodes are formed on the semiconductor layer 12 and constitute an anode electrode and a cathode electrode of the LED chip 15.

The protective layer 14 has a flat surface. The protective layer 14 has a translucency, sufficient hardness and brittleness. The protective layer 14 covers the second surface of the crystal growth substrate 11 where the fine irregularities 11a are formed.

Therefore, light generated in the semiconductor layer 12 constituting the light emitting element structure is transmitted through the protective layer 14 from the second surface of the crystal growth substrate 11 where the fine irregularities 11a are formed. Then, the light is emitted to the outside of the light emitting element 10.

A method of manufacturing the light emitting element 10 of the first embodiment will be described with reference to FIGS. 1A-1C and FIGS. 2A-2B.

Process 1 (see FIG. 1A): The semiconductor layer 12 is formed on the entire surface on a back side of a wafer of the flat crystal growth substrate 11. A plurality of electrodes 13 is formed on the semiconductor layer 12.

Then, the irregularities 11a are formed in the entire surface on a front side of the wafer of the crystal growth substrate 11.

The crystal growth substrate 11 is made of, for example, a gallium nitride substrate, a sapphire substrate, a silicon carbide substrate and the like.

Further, in order to form the irregularities 11a on the entire surface of the front side of the crystal growth substrate 11, various surface roughening processes (e.g., a pressing process, a sandblasting process, an etching process) can be performed.

Meanwhile, since the semiconductor layer 12 or electrodes 13 are subjected to the etching process, the etching process is preferably used to form the irregularities 11a.

Process 2 (see FIG. 1B): Without using an adhesive, the protective layer 14 is directly fixed to the entire surface on a second face of the wafer of the crystal growth substrate 11 where the irregularities 11a are formed. By doing so, a laminate LM is produced in which the wafer of the crystal growth substrate 11, the semiconductor layer 12 and the protective layer 14 are stacked.

The protective layer 14 is formed by a translucent material (e.g., a sintered body of a thermoplastic resin material such as glass, acrylic-based resin and nylon-based resin, a thermosetting resin material such as epoxy-based resin and silicon-based resin, and a transparent inorganic material such as sol-gel glass and alumina, etc.).

Meanwhile, in order to easily divide the protective layer 14 when dividing the laminate LM into respective light emitting elements 10 in Process 4 to be described later, a sintered body of the transparent inorganic material or glass having large brittleness, rather than the resin material having large toughness, is preferable.

A method of directly fixing the protective layer 14 to the wafer of the crystal growth substrate 11 can be properly selected, depending on the translucent material of forming the protective layer 14.

When the protective layer 14 is made of glass or thermoplastic resin material, flat glass or thermoplastic resin material can be thermally pressed to the crystal growth substrate 11.

When the protective layer 14 is made of thermosetting resin material, various coating methods (e.g., an electrostatic coating method, a spin coating method, a screen printing method, etc.) can be used to coat the liquid-phase thermosetting resin material on the crystal growth substrate 11. Then, the thermosetting resin material can be cured.

When the protective layer 14 is made of sol-gel glass, various coating methods can be used to coat the liquid-phase forming material (e.g., metal alkoxide such as tetraethoxysilane, etc.) of the sol-gel glass on the crystal growth substrate 11. Then, the forming material is hydrolyzed and then subjected to condensation polymerization, thereby obtaining a sol. Subsequently, water is removed from the sol to obtain a gel. The gel is sintered and vitrified. In this way, the sol-gel glass can be formed.

Process 3 (see FIG. 1C): In order to cause the laminate LM to have a desired thickness, the protective layer 14 is polished to a desired thickness and the surface of the protective layer 14 is flattened.

Meanwhile, when the protective layer 14 is made of the thermosetting resin material or the sol-gel glass, Process 3 may be omitted by optimizing the thickness of the protective layer 14 and flattening the surface of the protective layer 14 in Process 2.

Process 4 (see FIGS. 2A-2B): The laminate LM, where the wafer of the crystal growth substrate 11, the semiconductor layer 12 and the protective layer 14 are stacked, is cut by a scribe breaking, so that the laminate LM is divided and segmented into a plurality of chips. In this way, the light emitting element 10 is completed.

That is, as shown in FIG. 2A, scribe grooves 12a are formed on the surface of the semiconductor layer 12 by various scribing methods (e.g., a laser scribing method, a blade scribing method).

Here, the surface portions of the protective layer 14, which are located above the scribe grooves 12a of the semiconductor layer 12, are dividing line (scribe line) portions SL.

Next, a wafer fixing tape ET is adhered to the surface of the protective layer 14. The laminate LM is placed on support blades Pb in such a way that the scribe grooves 12a of the semiconductor layer 12 are opposed to gaps between the support blades Pb of a breaking device.

Subsequently, breaking blades Pa of the breaking device are pressed against the dividing line portions SL on the surface of the protective layer 14 via the wafer fixing tape TA, as indicated by an arrow a. By doing so, cracks in the longitudinal sectional direction, which have the scribe grooves 12a of the semiconductor layer 12 as dividing start points, are generated.

This operation is performed on each of the dividing line portions SL and the scribe grooves 12a, so that the cracks in the longitudinal sectional direction are generated in all of the dividing line portions SL.

Here, since the wafer fixing tape TA is formed of a material that is readily elastically deformable, the wafer fixing tape TA is not broken even when the breaking blades Pa are pressed.

Further, the protective layer 14 has hardness much higher than that of the wafer fixing tape TA. Accordingly, the load of the breaking blades Pa is securely applied to the surface of the protective layer 14 through the wafer fixing tape TA.

Then, as indicated in a direction of arrows β, β', the width of the cracks in the longitudinal sectional direction, which are generated in the laminate LM, is widened when the wafer fixing tape TA is stretched in a surface direction. In this way, the laminate LM is divided into a plurality of light emitting elements 10.

Operation/Effect of First Embodiment

According to the first embodiment, the following operation/effects can be obtained.

[1-1]

Since the light generated in the semiconductor layer 12 is diffused in the irregularities 11a on the second surface of the crystal growth substrate 11, it is possible to suppress the multiple reflections on the inside of the light emitting element 10. Accordingly, the light extraction efficiency of the light emitting element 10 can be improved.

Further, when the irregularities 11a are formed on the second surface of the crystal growth substrate 11, the reflectivity of the light that is generated in the semiconductor layer 12 and incident on the second surface is lowered. Accordingly, it is possible to increase the light transmittance, so that the light extraction efficiency of the light emitting element 10 can be improved.

As shown in FIG. 2B, when dividing the wafer of the stacked crystal growth substrate 11, the semiconductor layer 12 and the protective layer 14, into a plurality of light emitting elements 10, the breaking blades Pa of the breaking device are pressed against the surface of the protective layer 14.

At this time, even when the irregularities 11a are formed on the second surface of the crystal growth substrate 11, the surface of the protective layer 14 is flat and the protective layer 14 has a predetermined hardness and brittleness since the irregularities 11a are covered by the protective layer 14.

Therefore, the breaking blades Pa pressed against the surface of the protective layer 14 are not deviated and the contact positions of the breaking blades Pa are determined. Accordingly, the load from the breaking blades Pa is securely applied to the dividing line portions SL on the surface of the protective layer 14.

As a result, it is possible to prevent the occurrence of separation failure including that the crystal growth substrate 11 is divided from the portions other than the dividing line portions SL or the cross-section of the crystal growth substrate 11 is slanted and broken.

The predetermined hardness and brittleness assigned to the protective layer 14 refer to a hardness and brittleness sufficient for causing the protective layer 14 to be cut by the load applied from the breaking blades Pa.

[1-2]

As shown in FIG. 2B, when dividing the wafer of the stacked crystal growth substrate 11, the semiconductor layer 12 and the protective layer 14, into a plurality of light emitting elements 10, a wafer fixing tape ET is adhered to the surface of the protective layer 14.

At this time, even when the irregularities 11a are formed on the second surface of the crystal growth substrate 11, the surface of the protective layer 14 is flat since the irregularities 11a are covered by the protective layer 14. Accordingly, the adhesion of the wafer fixing tape ET is not damaged, so that it is possible to prevent the light emitting element 10 from being separated from the wafer fixing tape ET.

[1-3]

When feeding the light emitting element 10 by a collet (not shown) in order to mount the light emitting element 10 on a mounting substrate (not shown), the surface of the protective layer 14 is absorbed by the collet.

At this time, even when the irregularities 11a are formed on the second surface of the crystal growth substrate 11, the surface of the protective layer 14 is flat since the irregularities 11a are covered by the protective layer 14. Accordingly, the absorption of the collet is not damaged, so that it is possible to prevent the light emitting element 10 from being separated from the collet.

[1-4]

When bonding the light emitting element 10 to a wiring pattern (not shown) formed on a mounting substrate (not shown), it is required to apply load to the surface of the protective layer 14. At this time, even when the irregularities 11a are formed on the second surface of the crystal growth substrate 11, it is possible to prevent the irregularities 11a from being damaged by the application of the load since the irregularities 11a are covered by the protective layer 14.

[1-5]

When the irregularities 11a are formed on the second surface of the crystal growth substrate 11, the contact area between the second surface of the crystal growth substrate 11 and the protective layer 14 is increased. Accordingly, it is possible to firmly fix the second surface of the crystal growth substrate 11 and the protective layer 14.

[1-6]

When the crystal growth substrate 11 is a gallium nitride substrate, the gallium nitride substrate has a low light transmittance. Accordingly, it is required to cause the gallium nitride substrate to be thinner in order to improve the light extraction efficiency of the light emitting element 10. At this time, the separation failure is liable to occur especially in the thinned gallium nitride substrate. Further, the thinned gallium nitride substrate is liable to be damaged. Accordingly, the handling such as the tape transfer is difficult to perform.

However, in the first embodiment, even when the crystal growth substrate 11 is a thinned gallium nitride substrate, it is possible to prevent the separation failure from occurring in the crystal growth substrate 11, similarly to the operation/effect [1-1].

Further, in the first embodiment, the crystal growth substrate 11 is reinforced by the provision of the protective layer 14, so that the crystal growth substrate 11 is less likely to be damaged. Accordingly, it is easy to perform the handling such as the tape transfer.

Further, in the first embodiment, in addition to using the thinned gallium nitride substrate as the crystal growth substrate 11, the irregularities 11a are formed on the second surface of the crystal growth substrate 11 and covered by the protective layer 14. Accordingly, the emission of light in the side direction of the light emitting element 10 can be suppressed, so that it is possible to further improve the light extraction efficiency.

[1-7]

In a case that the crystal growth substrate 11 is a gallium nitride substrate, the gallium nitride substrate has a high reflectivity. Accordingly, it is difficult to sufficiently increase the light extraction efficiency of the light emitting element 10 just by forming the irregularities 11a on the second surface of the crystal growth substrate 11.

Therefore, the reflectivity of the protective layer 14 is set to be less than the reflectivity of the crystal growth substrate 11. By doing so, in cooperation with the irregularities 11a formed on the second surface of the crystal growth substrate 11, it is possible to sufficiently increase the light extraction efficiency of the light emitting element 10.

Meanwhile, the reflectivity of the protective layer 14 is suitably in a range of 2 or less, preferably in a range of 1.5 to 1.8.

[1-8]

In the manufacturing method of the light emitting element 10 according to the first embodiment, it is possible to improve productivity, as compared to a method of dividing each of the light emitting elements 10 from the wafer of the crystal growth substrate 11 and then forming the irregularities 11a on the second surface of the crystal growth substrate 11.

Second Embodiment

A light emitting element 10 of a second embodiment is different from the light emitting element of the first embodiment in that the protective layer 14 includes phosphors for converting a luminescent color (wavelength) of the emitted light of the LED chips 15.

The phosphors contained in the protective layer 14 may be a combination of phosphors emitting each of RGB colors, in addition to yellow light-emitting phosphors.

Further, the protective layer 14 may have a multilayer structure formed by stacking a plurality of layers containing phosphors whose light emitting wavelength is different from each other. For example, the protective layer 14 may have a four-layer structure formed by stacking a layer containing red light-emitting phosphors, a layer containing green light-emitting phosphors, a layer containing blue light-emitting phosphors and a layer containing yellow light-emitting phosphors.

When the protective layer 14 has a multilayer structure, in order to cause the light emitting element 10 to have a desired chromaticity, each layer may be polished to a predetermined thickness every time to form individual layer.

Here, when the protective layer 15 having a multilayer structure is made of a thermosetting resin material or sol-gel glass, polishing for individual layer may be omitted by optimizing the thickness of each layer.

Operation/Effect of Second Embodiment

According to the second embodiment, the following operation/effects can be obtained, in addition to the above operation/effects of the first embodiment.

[2-1]

In the light emitting element 10 of the second embodiment, the protective layer 14 functions as a luminescent color conversion member (wavelength conversion member or phosphor layer). Further, a primary light (blue light) is an excitation light emitted from the LED chips 15 and a portion of the primary light is excited by phosphors in the protective layer 14 to generate a luminescent color-converted (wavelength-converted) secondary light (yellow light). The primary light and the secondary light are mixed to generate a mixed-color light (white light). The mixed-color light is emitted to the outside through the protective layer 14.

Therefore, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting element 10 and surrounding components thereof are deteriorated due to the heat-generation. Accordingly, it is necessary to efficiently dissipate the heat generated by the phosphors.

In the light emitting element 10 of the second embodiment, the contact area between the second surface of the crystal growth substrate 11 and the protective layer 14 is increased by forming the irregularities 11a on the second surface of the crystal growth substrate 11.

As a result, the heat generated by the phosphors contained in the protective layer 14 can be effectively dissipated through the LED chips 15. Accordingly, in addition to improving the efficiency of the luminescent color conversion by suppressing the temperature rise of the phosphors, the components (protective layer 14 and LED chips 15) of the light emitting element 10 and surrounding components thereof can be prevented from being deteriorated by the heat-generation.

[2-2]

As the phosphors contained in the protective layer 14, combined body particles may be used which are obtained by mixing and binding phosphors and dispersed binders.

Figure 3A:
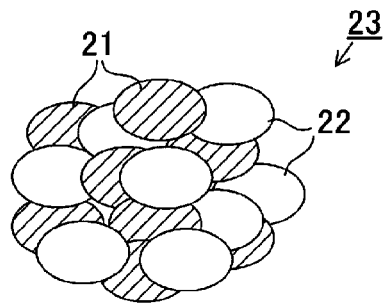
FIGS. 3A to 3C are longitudinal sectional views for explaining a method of manufacturing a protective layer 14 of an illustrative embodiment.

As shown in FIG. 3A, combined body particles (luminescent color conversion particles) 23 are manufactured by mixing phosphors 21 and dispersed binders 22 and associating/aggregating the phosphors 21 and the dispersed binders 22.

As the phosphors 21, any one of a garnet-based phosphor (e.g., YAG phosphor, LuAG phosphor, TAG phosphor, etc.), a SiAlON phosphor, a CASN phosphor, a fluoride-based phosphor and a BOS phosphor may be used. Among these, the garnet-based phosphor is preferred since it has a high thermal stability.

As the dispersed binders (binding materials) 22, any materials (e.g., alumina, etc.) may be used, so long as the materials have a transparency and a binding property to the phosphors 21. However, it is preferable to use the materials having the same components as the phosphors 21 since the binding property of the materials to the phosphors 21 can be enhanced. Further, in this case, since the refractive index difference between the materials and the phosphors 21 is small, it is also possible to reduce light loss.

When using the garnet-based phosphors as the phosphors 21, it is preferable to use alumina as the dispersed binders 22 since the garnet-based phosphors contain aluminum oxide.

Further, in order to associate/aggregate the phosphors 21 and the dispersed binders 22, any methods may be used. For example, a method of simply mixing the phosphors 21 and the dispersed binders 22, a method of mixing the phosphors 21 and the dispersed binders 22 in a proper solution to form a slurry and then removing the solution, a method of aggregating the phosphors 21 and the dispersed binders 22 and then sintering them, etc., may be used.

In the case of YAG, the particle size of each of the phosphors 21 is properly in a range of 1 to 7 µm, preferably in a range of 2 to 5 µm.

In the case where the particle size of the phosphors 21 is greater than the above range, the portion inside the protective layer 14, in which the phosphors 21 are not present, becomes larger when the protective layer 14 is thinly formed. Accordingly, it is not possible to obtain a uniform chromaticity distribution.

In the case where the particle size of the phosphors 21 is less than the above range, the efficiency of the luminescent color conversion by the excitation of the phosphors is lowered. Accordingly, it is not possible to obtain a desired luminescent color.

Further, by causing the particle size of the dispersed binders 22 to be substantially the same as the particle size of the phosphors 21, it is possible to uniformly mix and associate/aggregate the phosphors 21 and the dispersed binders 22.

Figure 3B:
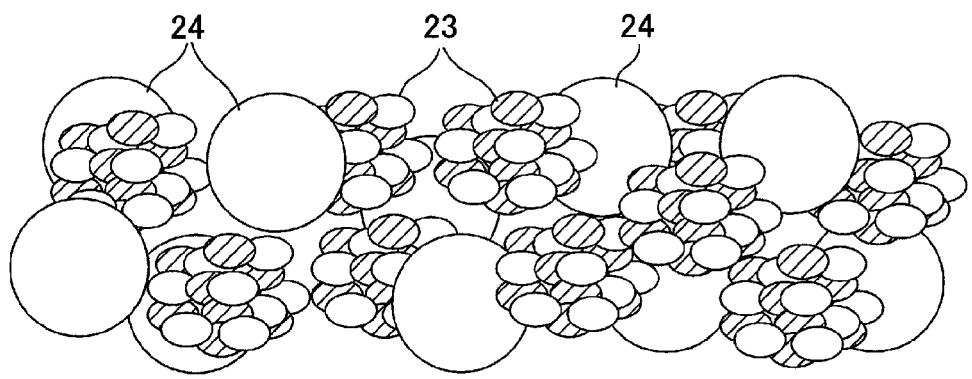

Further, in order to manufacture the protective layer 14, first, the combined body particles 23 and glass particles 24 having a low-melting point are mixed, as shown in FIG. 3B.

The particle size of the glass particles 24 is properly in a range of 10 μm or more, preferably in a range of 20 μm or more.

In the case where the particle size of the glass particles 24 is less than the above range, it is difficult to separate the impurities mixed in the glass particles 24. Accordingly, the yield of the glass particles 24 is reduced and thus the manufacturing cost of the glass particles 24 is increased.

Further, by causing the particle size of the combined body particles 23 to be substantially the same as the particle size of the glass particles 24, it is possible to uniformly mix the combined body particles 23 and the glass particles 24.

Figure 3C:
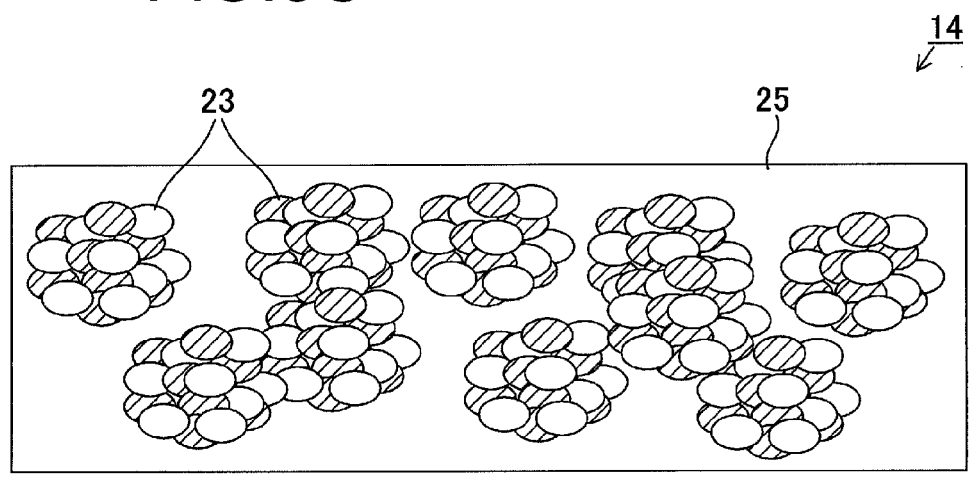

Next, as shown in FIG. 3C, mixed particles of the combined body particles 23 and the glass particles 24 are heated, the glass particles 24 are melted to form a melted glass and then the melted glass is cooled to form a glass 25.

In this way, the protective layer 14, which is made of a sintered body of the mixed particles of the combined body particles 23 and the glass particles 24 and the combined body particles 23 are dispersed in the glass 25, is completed.

In the combined body particles 23, the phosphors 21 are bonded in a state of being dispersed by the dispersed binders 22. In other words, the dispersed binders 22 have a function of binding the phosphors 21 and a function of dispersing the phosphors 21.

The glass particles 24 have a function of binding the combined body particles 23 and a function of dispersing the combined body particles 23.

Therefore, by sufficiently increasing the particle size of the combined body particles 23 and then causing the particle size of the combined body particles 23 to be substantially the same as the particle size of the glass particles 24, it is possible to uniformly mix the combined body particles 23 and the glass particles 24 even when the particle size of the phosphors 21 is reduced.

That is, in the protective layer 14, the particle size of the phosphors 21 is not defined by the particle size of the glass particles 24 and the particle size of the combined body particles 23 is defined by the particle size of the glass particles 24. Accordingly, it is possible to sufficiently increase the particle size of the glass particles 24 and it is easy to separate the impurities mixed in the glass particles 24. As a result, the yield of the glass particles 24 is improved and it is possible to reduce the manufacturing cost of the glass particles 24.

Further, by reducing the particle size of the phosphors 21, the part of the interior of the protective layer 14, in which the phosphors 21 are not present, becomes extremely small even when the protective layer 14 is thinly formed. Accordingly, it is possible to obtain a uniform chromaticity distribution.

Further, by reducing the particle size of the phosphors 21, it is possible to produce a state where a plurality of phosphors 21 are distributed to be overlapped in a thickness direction of the protective layer 14 even when the protective layer 14 is thinly formed. Accordingly, the scattering of light by at least one of the phosphors 21 or the dispersed binders 22 occurs in the interior of the protective layer 14, so that it is possible to obtain more uniform chromaticity distribution.

Accordingly, in the protective layer 14 manufactured as described above, the particle size of the phosphors 21 is reduced, the phosphors 21 are uniformly and densely dispersed in the interior of the protective layer 14 and a state is obtained where a plurality of phosphors 21 are distributed to be overlapped in a thickness direction of the protective layer 14. As a result, it is possible to obtain a uniform chromaticity distribution.

Further, the protective layer 14 where the combined body particles 23 are dispersed in the glass 25 has a high brittleness.

Therefore, when dividing the wafer of the stacked crystal growth substrate 11, the semiconductor layer 12 and the protective layer 14 into a plurality of light emitting elements 10 by a breaking, the protective layer 14 can be easily cut by the load applied from the breaking blades Pa. Accordingly, it is possible to reliably prevent the occurrence of the separation failure.

[2-3]

In the above operation/effect [2-2], the combined body particles 23 are produced by the association/aggregation of the particles of the phosphors 21 and the particles of the dispersed binders 22.

However, since it is difficult to control the association/aggregation state, it is difficult to control the particle size of the combined body particles 23.

For this reason, the combined body particles 23 may be produced using the following method. That is, respective raw materials of the phosphors and the dispersed binders are mixed and then fired, thereby producing a combined body where particulate phosphors and particulate dispersed binders are mixed to each other. Then, the combined body is pulverized to produce the combined body particles 23.

This method is preferable since the existing techniques for pulverizing the combined body particles 23 can be applied and it is possible to improve productivity.

That is, the combined body particles (luminescent color conversion particles) 23 may be a particle obtained by the association/aggregation of the particles of the phosphors and the particles of the dispersed binders, or a particle of a sintered body of the phosphors and the dispersed binders.

Third Embodiment

A light emitting element 10 of a third embodiment is different from the light emitting element of the first embodiment in that the protective layer 14 includes a light scattering material (e.g., silica, titanium oxide, etc.) for scattering the emitted light of the LED chips 15.

In the third embodiment, the protective layer 14 containing the light scattering material functions as a light scattering member and the light incident on the protective layer 14 from the crystal growth substrate 11 is scattered by the light scattering material in the protective layer 14. Accordingly, in addition to the above operation/effects of the first embodiment, it is possible to suppress the multiple reflections on the inside of the protective layer 14, so that the light extraction efficiency of the light emitting element 10 can be further improved.

Meanwhile, the protective layer 14 may be formed by a translucent material in which voids (bubbles) for scattering the emitted light of the LED chips 15 are formed.

When the translucent material is a sintered body of a transparent inorganic material or glass, voids that are naturally produced during firing can be used. Accordingly, it is possible to improve productivity.

Furthermore, since the protective layer 14 having voids formed therein can be easily broken, the protective layer 14 can be easily divided, when being divided into each light emitting element 10.

Fourth Embodiment

Figure 4A:
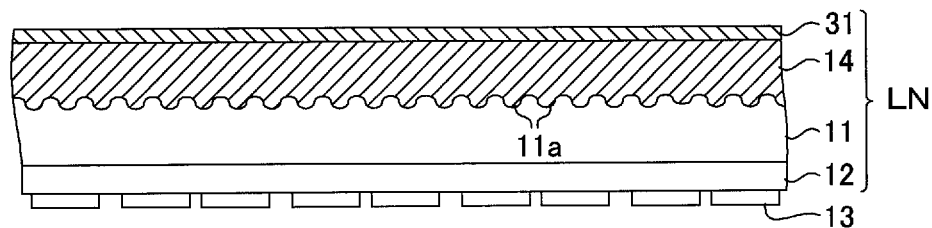
FIGS. 4A to 4C are longitudinal sectional views for explaining a method of manufacturing the light emitting element 30.
Figure 4B:
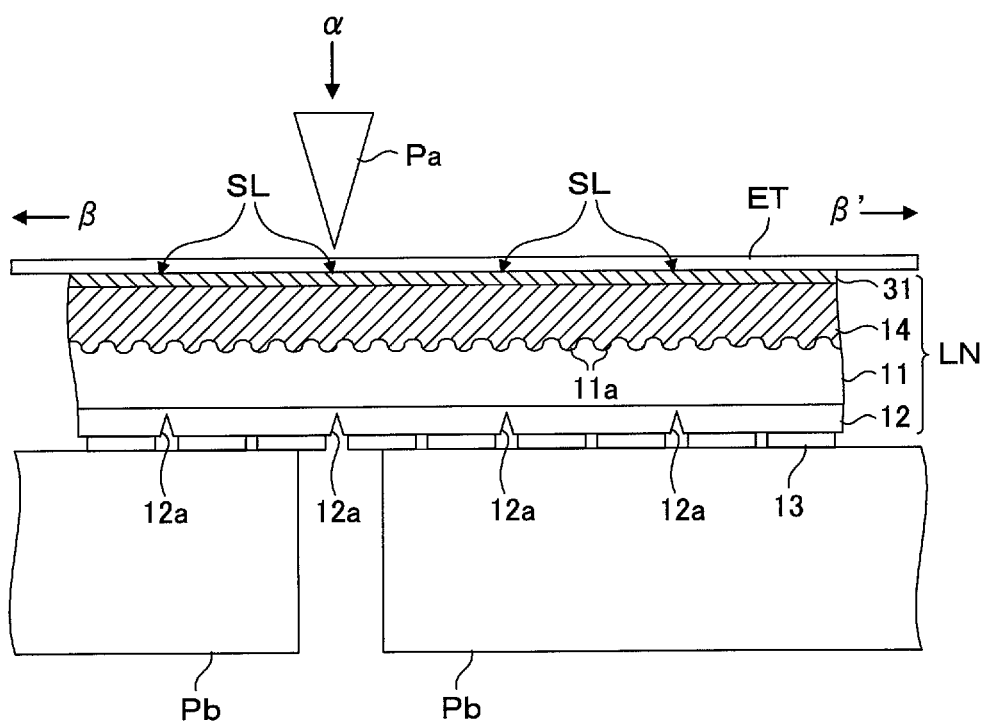
Figure 4C:
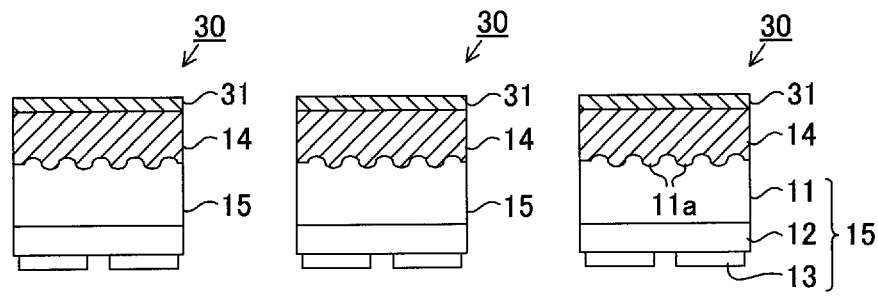

As shown in FIG. 4B, a light emitting element 30 of a fourth embodiment includes the protective layer 14, the LED chips 15 and an optical thin film (optical coating) 31.

The light emitting element 30 of the fourth embodiment is different from the light emitting elements 10 of the first to third embodiments in that the optical thin film 31 covering the whole surface on the front face of the protective layer 14 is formed.

The surface of the optical thin film 31 is flat. Of the light generated in the semiconductor layer 12 constituting the light emitting element structure, only the light having a desired wavelength is transmitted through the optical thin film 31 and emitted to the outside from the light emitting element 30.

In the fourth embodiment, in addition to the above operation/effects of the first embodiment, it is possible to control the wavelength of the emitted light of the light emitting element 30 by providing the optical thin film 31.

A method of manufacturing the light emitting element 30 of the fourth embodiment will be described with reference to FIGS. 1A-1C and FIGS. 4A-4C.

Process 1 (see FIG. 1A), Process 2 (see FIG. 1B) and Process 3 (see FIG. 1C): Same as Process 1 to Process 3 of the first embodiment.

Process 4 (see 4A): The optical thin film 31 is formed on the surface of the protective layer 14, thereby manufacturing a laminate LN where the wafer of the crystal growth substrate 11, the semiconductor layer 12, the protective layer 14 and the optical thin film 31 are stacked.

Process 4 (see FIGS. 4B and 4C): The laminate LN (the wafer of the crystal growth substrate 11, the semiconductor layer 12, the protective layer 14 and the optical thin film 31) is cut by a scribe breaking, so that the laminate LM is divided and segmented into a plurality of chips. In this way, the light emitting element 30 is completed.

Other Embodiments

The present invention is not limited to each of the above-described embodiments but may be embodied as follows. Also in these cases, it is possible to obtain the operation/effects equal to or better than each of the above-described embodiments.

[A] In each of the above embodiments, the scribe grooves 12a are formed on the surface of the semiconductor layer 12.

However, in the first to third embodiments, the scribe grooves 12a may be formed on the surface of the protective layer 14.

Further, in the fourth embodiment, the scribe grooves 12a may be formed from the surface of the optical thin film 31 to the protective layer 14.

[B] In each of the above embodiments, the light emitting elements 10 are divided from the laminate LM (the wafer of the crystal growth substrate 11, the semiconductor layer 12 and the protective layer 14) or the laminate LN (the wafer of the crystal growth substrate 11, the semiconductor layer 12, the protective layer 14 and the optical thin film 31) by the scribe breaking.

However, the light emitting elements 10 may be divided from the laminates LM, LN by a cutting method (e.g., see JP-A-2007-165855, JP-A-2007-165850 and JP-A-2007-142001) that is carried out as follows. That is, a laser beam is irradiated to the laminates LM, LN in a state where a focusing point thereof is set at the inside of the laminates LM, LN. By doing so, a modified region formed by multi-photon absorption is obtained. Then, the cutting having the modified region as a cutting start point is carried out.

[C] The LED chips 15 may be substituted with any semiconductor light emitting element (e.g., EL (Electro Luminescence) element, etc.).

Further, the LED chips 15 may be a face-up type where the protective layer 14 side is mounted/carried on a mounting substrate (not shown) or may be a face-down type where the semiconductor layer 12 side is mounted/carried on a mounting substrate.

[D] The present invention may be implemented by appropriately combining each of the embodiments. In this case, the operation/effects of the combined embodiments can be additionally obtained or synergy effects can be obtained.

The present invention is not limited to the description of respective illustrative embodiments and each of the aspects. The present invention also includes various modifications which can be easily conceived by those skilled in the art without departing from the description of the claims. The contents of publications mentioned in the present specification are incorporated by reference in its entity.

What is claimed is:

1. A light emitting element comprising: a crystal growth substrate formed in a flat shape and that has a translucency; a semiconductor layer that constitutes a light emitting element structure and is formed at a side of a first surface of the crystal growth substrate; irregularities formed on a second surface of the crystal growth substrate, the second surface being an opposite surface of the first surface; and a protective layer that has a translucency and a predetermined hardness and brittleness, and covers the irregularities formed on the second surface of the crystal growth substrate, wherein the protective layer comprises at least one of phosphors and light-scattering material, wherein the protective layer includes a flat surface parallel to the first surface wherein the protective layer comprises a mixed particles of combined body particles, in which mixtures of phosphors and dispersed binders are bound, and the combined body particles are dispersed in a glass, and wherein the dispersed binders are non-glass materials having a translucency and a binding property to the phosphors.

2. The light emitting element according to claim 1, further comprising:
an optical thin film that covers an entire surface of a front surface side of the protective layer.

3. A method of manufacturing the light emitting element according to claim 1, the method comprising:
a first process for forming the semiconductor layer at a side of a first surface of a wafer of the crystal growth substrate;
a second process for forming the irregularities on a second surface of the wafer of the crystal growth substrate;

a third process for forming the protective layer at a side of the second surface of the wafer of the crystal growth substrate, the protective layer covering and contacting the irregularities; and a fourth process for dividing, the wafer of the crystal growth substrate, the semiconductor layer and the protective layer which are stacked, into a plurality of light emitting elements by adhering a wafer fixing tape to the protective layer and pressing a breaking blade of a breaking device against a dividing line portion on a surface of the protective layer via the wafer fixing tape.

4. The light emitting element according to claim 1, wherein the protective layer includes the flat surface in a stacking direction of the light emitting element.

5. The light emitting element according to claim 1, wherein the protective layer directly contacts the irregularities.

6. The light emitting element according to claim 1, wherein the protective layer and the crystal growth substrate are sequentially stacked.

7. The light emitting element according to claim 1, wherein the protective layer and the crystal growth substrate do not have a material disposed therebetween.

8. The light emitting element according to claim 1, further comprising:
an optical thin film that contacts an entire surface of a front surface side of the protective layer.

9. The light emitting element according to claim 1, further comprising:
an optical thin film that contacts and covers an entire surface of a front surface side of the protective layer.

10. The light emitting element according to claim 1, wherein the protective layer comprises a sintered body having voids.

11. The light emitting element according to claim 1, wherein a surface of the protective layer is flat compared with the irregularities of the second surface.

12. A light emitting element comprising: a crystal growth substrate formed in a flat shape and that has a translucency; a semiconductor layer that constitutes a light emitting element structure and is formed at a side of a first surface of the crystal growth substrate; irregularities formed on a second surface of the crystal growth substrate, the second surface being an opposite surface of the first surface; and a protective layer that has a translucency and a predetermined hardness and brittleness, wherein the protective layer comprises at least one of phosphors and light-scattering material, wherein the protective layer covers and contacts the irregularities formed on the second surface of the crystal growth substrate, wherein the protective layer includes a flat surface parallel to the first surface wherein the protective layer includes a flat surface parallel to the first surface, wherein the protective layer comprises a mixed particles of combined body particles, in which mixtures of phosphors and dispersed binders are bound, and the combined body particles are dispersed in a glass, and wherein the dispersed binders are non-glass materials having a translucency and a binding property to the phosphors.

* * * * *